US010204196B1

(12) United States Patent
Torregrossa et al.

(10) Patent No.: US 10,204,196 B1
(45) Date of Patent: Feb. 12, 2019

(54) SYSTEM AND METHOD FOR REDUCING SIMULATION TIME WHEN SIMULATING ELECTRICAL CIRCUITS

(71) Applicant: Keysight Technologies, Inc., Minneapolis, MN (US)

(72) Inventors: Philippe Torregrossa, Verson (FR); Arnaud Soury, Malakoff (FR)

(73) Assignee: Keysight Technologies, Inc., Santa Rosa, CA (US)

( * ) Notice: Subject to any disclaimer, the term of this patent is extended or adjusted under 35 U.S.C. 154(b) by 156 days.

(21) Appl. No.: 15/166,804

(22) Filed: May 27, 2016

(51) Int. Cl.
  *G06F 17/50* (2006.01)
(52) U.S. Cl.
  CPC ................................ *G06F 17/5036* (2013.01)
(58) Field of Classification Search
  None
  See application file for complete search history.

(56) References Cited

U.S. PATENT DOCUMENTS 5,799,172 A * 8/1998 Gullapalli .......... G06F 17/5036
  703/14
5,889,687 A * 3/1999 Enda .................. G06F 17/5036
  703/12
6,442,735 B1 * 8/2002 Joshi .................. G06F 17/5036
  716/115

OTHER PUBLICATIONS

Wu et al., "Time-Domain Segmentation based Massively Parallel Simulation for ADCs", Design Automation Conference (DAC), 2013 50th ACM/EDAC/IEEE, May 29, 2013-Jun. 7, 2013.
Bichen Wu, "Time-Domain Segmentation based Massively Parallel Simulation", Dept. Micro/nano electronics Tsinghua Univ., 2013, pp. 1-22.

* cited by examiner

*Primary Examiner* — Craig C Dorais

(57) ABSTRACT

A system and method are provided that reduce the amount of time required to perform transient circuit and envelope transient circuit simulations. The total simulation time is partitioned into n simulation segments of equal lengths of time and adjacent simulation segments are overlapped in time by a predetermined overlap time period, $T_{ov}$. The simulation segments are then simulated in parallel and the simulation results are merged into a final simulation waveform. The predetermined overlap time period $T_{ov}$ is determined using a non-iterative process that can be performed very quickly. Consequently, the overall amount of time that is required to perform the simulation is greatly reduced.

20 Claims, 6 Drawing Sheets

SYSTEM AND METHOD FOR REDUCING SIMULATION TIME WHEN SIMULATING ELECTRICAL CIRCUITS

BACKGROUND

Electronic design automation (EDA) tools are used to design electronic circuits used in a variety of electronic systems, such as, for example, printed circuit boards (PCBs) and integrated circuits (ICs). When using an EDA tool to design electronic circuits, the electronic circuit designs are simulated and the results of the simulations are analyzed to check the integrity of the designs and predict their behavior. For example, Simulation Program with Integrated Circuit Emphasis (SPICE) is a software program often used with EDA tools to simulate IC and PCB-level circuit designs to check their integrity and predict their behavior.

Depending on the complexity of the circuit design and the type of simulation being performed, the simulations can take a long period of time to perform. Parallel circuit simulation techniques are currently used by EDA tools to reduce the time period required to perform circuit simulations. For example, it is known to decompose a circuit simulation task into sub-tasks, assign each sub-task to one of a plurality of central processing unit (CPU) cores and to perform the sub-tasks in parallel on the CPU cores. Such techniques are very effective at reducing simulation times for very large circuit designs, but are not as beneficial for smaller circuit designs.

One known parallelization technique seeks to reduce simulation times for transient circuits having short memories. The technique, disclosed in an article entitled "Time-Domain Segmentation based Massively Parallel Simulation for ADCs", by Wu, et al, published in Design Automation Conference (DAC), 2013 50$^{th}$ ACM/EDAC/IEEE, May 29, 2013-Jun. 7, 2013, comprises partitioning a transient simulation task into n segments of equal lengths of time, overlapping adjacent segments by an overlap time, $T_{ov}$, performing transient simulations for all of the segments concurrently in respective CPU cores, and then conjoining the resulting waveforms while discarding the $T_{ov}$ beginning portion of each waveform except for the first waveform. Because transient circuits have memory, it necessary to overlap adjacent segments to account for memory effects. The overlap time $T_{ov}$ is determined algorithmically by performing an iterative algorithm comprising: (1) initially setting $T_{ov}$ to zero or some other value; (2) performing the above-described simulation and determining whether adjacent resulting waveforms have converged; (3) if they have not converged, incrementing the value of $T_{ov}$ and performing steps (2) and (3) until convergence of adjacent waveforms has been verified. The value of $T_{ov}$ at which convergence was verified is then used as $T_{ov}$ during actual simulation.

One of the disadvantages of the technique disclosed in Wu, et al. is that the process of determining the appropriate overlap time $T_{ov}$ is time consuming. It would be advantageous to provide an EDA system and method that allow the overlap time $T_{ov}$ to be quickly and accurately determined without having to perform the above-described iterative process.

SUMMARY

The present embodiments are directed to an EDA system, method and computer program that reduce the amount of time required to perform analog circuit simulation. The EDA system comprises a user interface (UI), memory and processing logic in communication with the UI and with memory. The processing logic is configured to simulate circuits by:

for a preselected analog circuit to be simulated using a transient-based algorithm, determining an overlap time period, $T_{ov}$, based on an amount of time required for the output signals of the preselected analog circuit to settle to steady state when predetermined input signals are used during a simulation of the preselected analog circuit;

segmenting the total simulation time for the transient-based simulation into n simulation time segments, where n is a positive integer that is greater than or equal to 2;

overlapping respective beginning portions of second through n$^{th}$ simulation time segments with respective end portions of first through (n−1)$^{th}$ simulation time segments, respectively, by the overlap time period, $T_{ov}$;

simulating the n simulation time segments in parallel to obtain n intermediate simulation results, respectively, wherein second through n$^{th}$ intermediate simulation results have beginning portions of time lengths $T_{ov}$ corresponding to the overlapped beginning and end portions of adjacent simulation time segments; and truncating all but the first intermediate simulation results by discarding the beginning portions of all but the first intermediate simulation results and merging the intermediate simulation results into a final simulation result.

The method comprises:
in processing logic:
  determining an overlap time period, $T_{ov}$, based on an amount of time required for the output signals of the preselected analog circuit to settle to steady state when predetermined input signals are used during a simulation of the preselected analog circuit;
  segmenting the total simulation time for the transient-based simulation of the preselected analog circuit into n simulation time segments, where n is a positive integer that is greater than or equal to 2;
  overlapping respective beginning portions of second through n$^{th}$ simulation time segments with respective end portions of first through (n−1)$^{th}$ simulation time segments, respectively, by the overlap time period, $T_{ov}$;
  simulating the n simulation time segments in parallel to obtain n intermediate simulation results, respectively, wherein second through n$^{th}$ intermediate simulation results have beginning portions of time lengths $T_{ov}$ corresponding to the overlapped beginning and end portions of adjacent simulation time segments; and
  truncating all but the first intermediate simulation results by discarding the beginning portions of all but the first intermediate simulation results and merging the intermediate simulation results into a final simulation result.

The computer program, which is embodied on a non-transitory computer-readable medium, comprises first, second and third code portions. The first code portion determines an overlap time period, $T_{ov}$, based on an amount of time required for an output signal of a preselected analog circuit to settle to steady state when predetermined input signals are used during a simulation of the preselected analog circuit. The second code portion segments a total simulation time for the preselected analog circuit simulation into n simulation time segments, where n is a positive integer that is greater than or equal to 2. The third code portion overlaps respective beginning portions of second through $n^{th}$ simulation time segments with respective end portions of first through $(n-1)^{th}$ simulation time segments, respectively, by the overlap time period, $T_{ov}$. The fourth code portion allocates the overlapped simulation time segments to n processing cores for simulation of the n simulation time segments, respectively.

These and other features and advantages will become apparent from the following description, claims and drawings.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
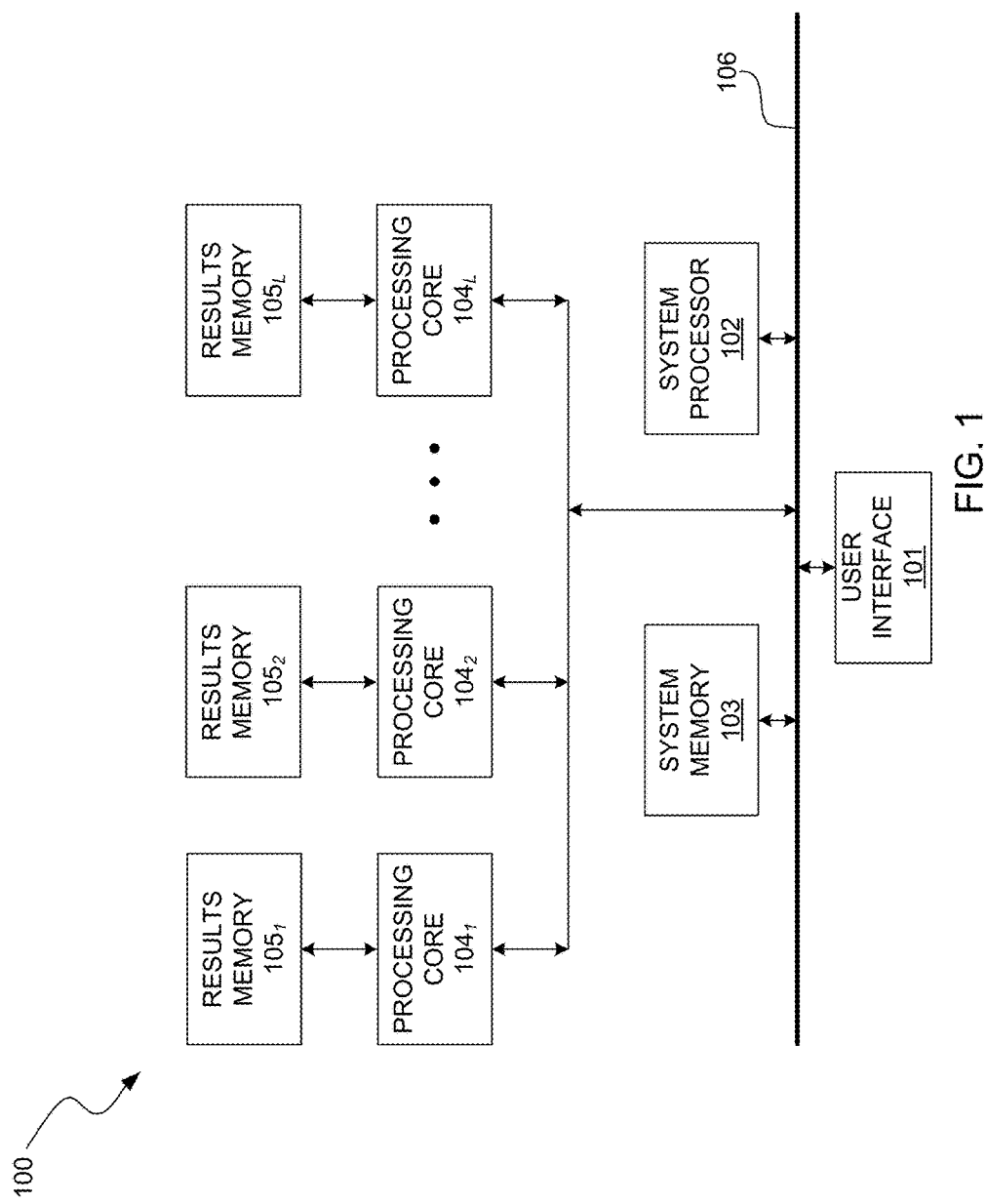
FIG. 1 illustrates a block diagram of an EDA system in accordance with an exemplary embodiment for simulating an analog circuit.

In accordance with embodiments described herein, a system and method are provided that reduce the amount of time required to perform analog circuit simulations. The total simulation time is partitioned into n simulation segments of equal lengths of time and adjacent simulation segments are overlapped in time by a predetermined overlap time period, $T_{ov}$. The simulation segments are then simulated in parallel and the simulation results are merged into a final simulation waveform. The predetermined overlap time period $T_{ov}$ is determined using a non-iterative process that can be performed very quickly relative to aforementioned known process that uses iterative simulations to determine $T_{ov}$ before performing the actual simulation. Consequently, the overall amount of time that is required to perform the simulation is greatly reduced.

In the following detailed description, for purposes of explanation and not limitation, exemplary, or illustrative, embodiments disclosing specific details are set forth in order to provide a thorough understanding of an example of the manner in which the present invention can be embodied. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

As used in the specification and appended claims, the terms "a," "an," and "the" include both singular and plural referents, unless the context clearly dictates otherwise. Thus, for example, "a device" includes one device and plural devices. Relative terms may be used to describe the various elements' relationships to one another, as illustrated in the accompanying drawings. These relative terms are intended to encompass different orientations of the device and/or elements in addition to the orientation depicted in the drawings. It will be understood that when an element is referred to as being "connected to" or "coupled to" or "electrically coupled to" another element, it can be directly connected or coupled, or intervening elements may be present.

The term "memory" or "memory device", as those terms are used herein, are intended to denote a computer-readable storage medium that is capable of storing computer instructions, or computer code, for execution by one or more processors. The term "computer code," as that term is used herein, is intended to denote software and/or firmware designed for execution by a processor or processing core. References herein to "memory" or "memory device" should be interpreted as one or more memories or memory devices. The memory may, for example, be multiple memories within the same computer system. The memory may also be multiple memories distributed amongst multiple computer systems or computing devices.

A "processor," "processing core," or "processing logic," as those terms are used herein, encompass an electronic component that is able to execute a computer program or executable computer instructions. References herein to a computer comprising "a processor" should be interpreted as a computer having one or more processors or processing cores. The processor may for instance be a multi-core processor. A processor may also refer to a collection of processors within a single computer system or distributed amongst multiple computer systems. The term "computer" should also be interpreted as possibly referring to a collection or network of computers or computing devices, each comprising a processor or processors. Instructions of a computer program can be performed by multiple processors that may be within the same computer or that may be distributed across multiple computers.

FIG. 1 illustrates a block diagram of an EDA system 100 in accordance with an exemplary embodiment for simulating an analog circuit having memory effects. The EDA system 100 has a user interface (UI) 101 that is typically a graphical user interface (GUI), a system processor 102, a system memory 103, a plurality of processing cores $104_1$-$104_L$, and a plurality of results memory devices 1051-105L, where L is a positive integer that is greater than or equal to one. The system processor 102 executes computer code stored in the system memory 103. The system processor 102 may also have on-board memory that stores computer code for execution by the system processor 102. The system memory 103, the UI 101 and the system processor 102 are in communication with one another via a system bus 106. The processing cores 104₁-104_L are in communication with the system bus 106.

The UI 101 typically includes an input device (e.g., a keyboard and a mouse) and a display device. The UI 101, the system processor 102 and the system memory 103 are typically part of a work station computer, such as a personal computer (PC). The processing cores 104₁-104_L may be part of the work station of they may be part of a network that is external to the work station and connected to the work station by a suitable network connection, e.g., an Ethernet port or an optical port of the work station and an Ethernet cable or an optical fiber cable.

Figure 2:
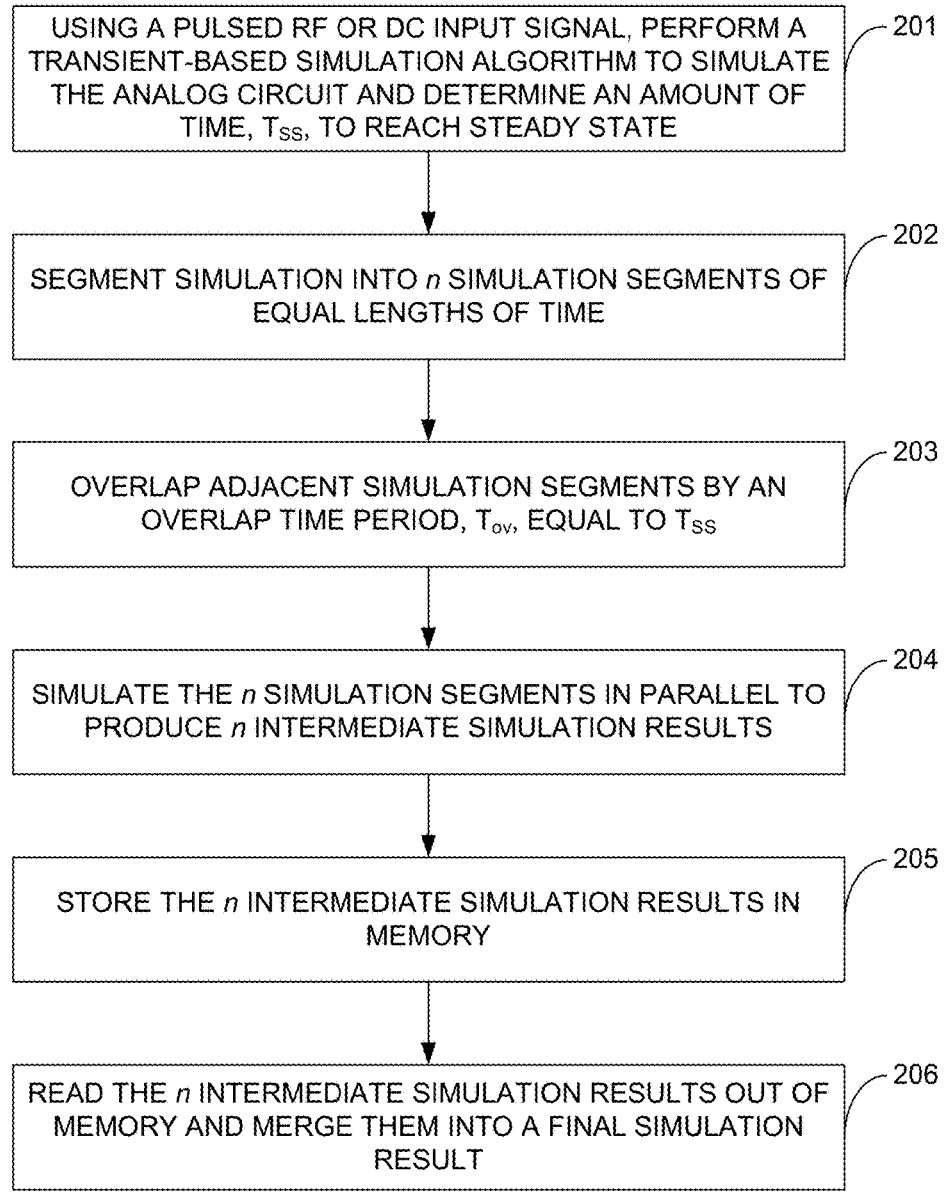
FIG. 2 illustrates a flow diagram of the method in accordance with an exemplary embodiment.

FIG. 2 illustrates a flow diagram of the method in accordance with an exemplary embodiment. As indicated above, the method involves partitioning the simulation to be performed into n simulation segments of equal lengths of time, overlapping adjacent simulation segments in time by a predetermined overlap time period $T_{ov}$, simulating the simulation segments in parallel to produce intermediate simulation results, and merging the intermediate simulation results into a final simulation waveform, where n is a positive integer that is greater than or equal to 2. Block 201 represents the non-iterative process for determining the overlap time period $T_{ov}$, for overlapping adjacent simulation segments. The overlap time period $T_{ov}$ is determined as follows. As will be described below in more detail with reference to FIGS. 6 and 7, preferably a pulsed radio frequency (RF) or direct current (DC) signal is used as the input signal for the analog circuit being simulated. During the transient-based simulation, the amount of time that it takes the output of the simulated circuit to reach stead state, $T_{SS}$, is determined. The value of $T_{SS}$ is then used as the value of $T_{ov}$ to overlap adjacent segments. In accordance with the embodiment shown in FIG. 1, the non-iterative process represented by block 201 is performed by the system processor 102.

Block 202 represents the step of segmenting the simulation into n simulation segments of equal lengths of time. Adjacent simulation segments are then overlapped in time by $T_{ov}$, as indicated by block 203. In accordance with the illustrative embodiment shown in FIG. 1, the steps represented by blocks 202 and 203 are performed by the system processor 102. The n simulation segments are then simulated in parallel, producing n intermediate simulation results, as indicated by block 204. The intermediate simulation results are stored in memory, as indicated by block 205. In accordance with the illustrative embodiment shown in FIG. 1, the steps represented by blocks 204 and 205 are performed by L of the processing cores 104₁-104_L, respectively, and the respective intermediate simulation results are stored in the respective results memory devices 105₁-105_L. It should be noted that the system processor 102 could be a multi-core processor capable of simulating multiple simulation segments, in which case fewer or none of the processing cores 104₁-104_L are utilized. Also, while FIG. 1 depicts the core processors 104₁-104_L having respective results memory devices 105₁-105_L, a single results memory device could be used to store all of the intermediate results or the intermediate results could instead be stored in system memory 103. Block 206 represents the step of reading the intermediate simulation results out of memory and merging them into a final simulation result, i.e., a final waveform. In the step represented by block 206, the overlapping portions at the beginnings of the intermediate results are discarded prior to merging the intermediate results together, as will be described below in more detail with reference to FIGS. 3-5B. In accordance with the illustrative embodiment shown in FIG. 1, the step represented by block 206 is performed by the system processor 102.

Figure 3:
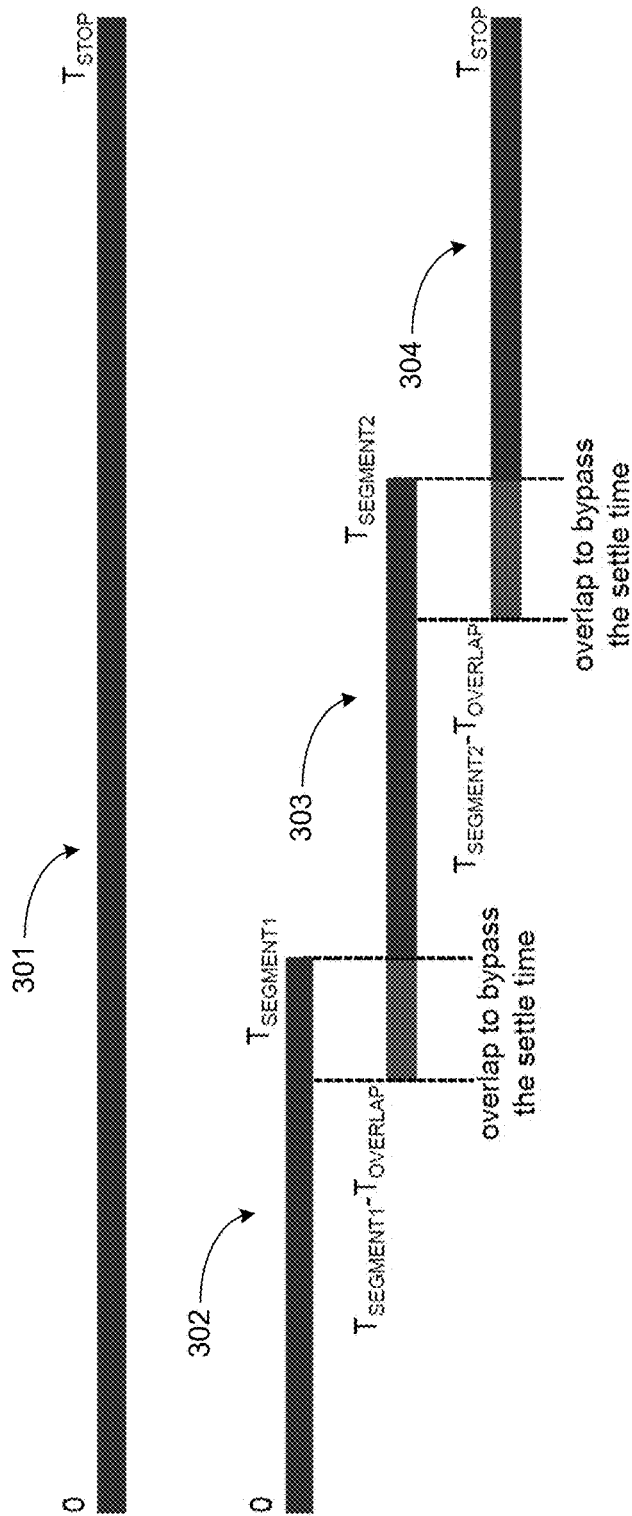
FIG. 3 illustrates an example of a simulation that is segmented into three simulation segments of equal lengths of time and overlapped in time by a predetermined time period.

The method and system of the invention are particularly well suited for simulating analog circuits that have memory effects, but that also have steady state regimes that do not depend on initial conditions. FIG. 3 illustrates an example of a simulation that is segmented into three simulation segments of equal lengths of time. Thus, FIG. 3 illustrates a case where n=3. If the analog circuit to be simulated does not exhibit memory effect, then it would not be necessary to overlap adjacent segments in time. Because analog circuits typically have memory effects, it is necessary to overlap adjacent segments in time in order to achieve an accurate final simulation result. As indicated above, the present invention provides an accurate and efficient non-iterative process for determining $T_{ov}$, as will be described below in more detail with reference to FIGS. 4-5B.

With reference to FIG. 3, a total simulation time 301 is segmented into first, second and third simulation time segments 302, 303 and 304, respectively. The total simulation time extends from time T=0 to time $T_{Stop}$. The first simulation time segment 302 extends from time T=0 to time $T_{Segment1}$. The second simulation time segment 303 extends from time $T=T_{Segment1}-T_{ov}$ to time $T_{Segment2}$. The third simulation time segment 304 extends from time $T=T_{Segment2}-T_{ov}$ to time $T_{Stop}$. The overlap time period $T_{ov}$ of the second and third simulation time segments 303 and 304, respectively, allows the circuit being simulated time to settle to steady state so that the intermediate results are the same as the results that would be achieved using traditional simulation methods that do not use segmentation. As will be described below in detail with reference to a simulation example, the portions of the intermediate results corresponding to the time overlaps are discarded when merging the intermediate results into a final simulation result. The final simulation result achieved with the invention is the same as the final simulation result achieved using traditional methods, except that the simulation method of the invention can be performed in a shorter overall amount of time due parallelization achieved by performing the time simulation segments in parallel.

Figure 4:
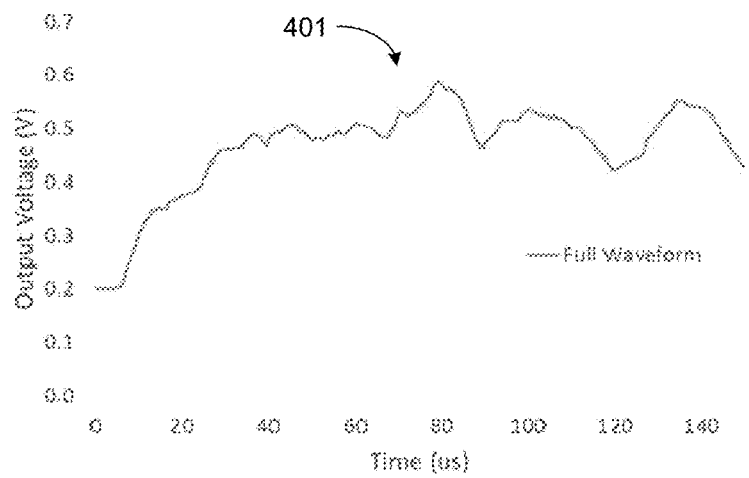
FIG. 4 illustrates an output voltage waveform for an analog circuit obtained using a traditional transient circuit envelope simulation algorithm to simulate the circuit from time T=0 to time $T_{Stop}$=150 microseconds.

FIG. 4 illustrates an output voltage waveform 401 for an analog circuit (not shown) obtained using a traditional transient circuit envelope simulation algorithm to simulate the circuit from time T=0 to time $T_{Stop}$=150 microseconds (μs). If the simulation were to be split into two ideal segments without overlap, the first simulation time segment would be simulated from time T=0 to time $T_{Stop}/2$ (0 to 75 μs) and the second simulation time segment would be simulated from time $T=T_{Stop}/2$ to time $T_{Stop}$ (75 μs to 150 μs). However, without overlapping the first and second simulation time segments in time by the proper overlap time period $T_{ov}$, the final result obtained by merging the intermediate results would not be accurate due to memory effect.

Figure 5A:
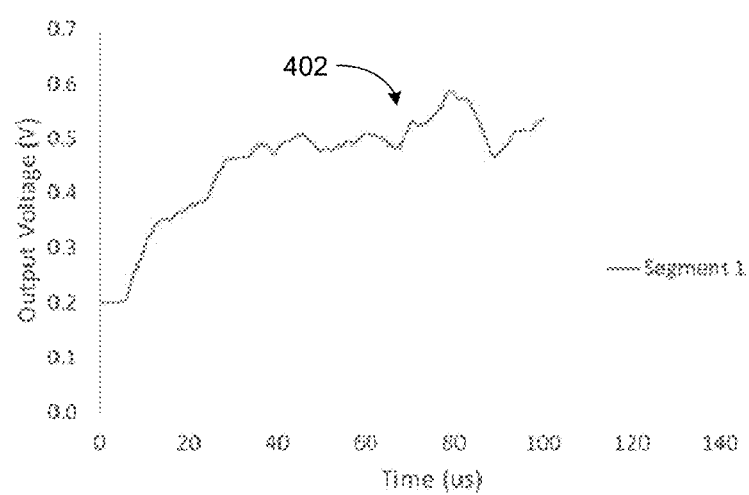
FIGS. 5A and 5B illustrate first and second simulation time segments obtained by partitioning the simulation that produced that output waveform shown in FIG. 4 into first and second simulation time segments, respectively, and overlapping the first and second simulation time segments by a predetermined overlap time period.
Figure 5B:
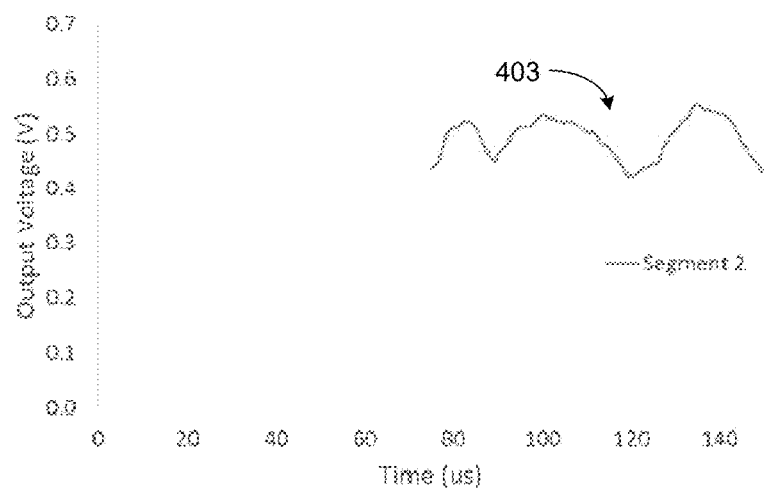

Using the same example and partitioning, or segmenting, the simulation into first and second simulation time segments that are overlapped, the resulting intermediate output voltage waveforms 402 and 403, respectively, are shown in FIGS. 5A and 5B, respectively. In the example, it is assumed that step 201 shown in FIG. 2 results in a determination that $T_{ov}$=20 μs. The first simulation time segment extends from time T=0 to time $T=T_{Stop}/2+T_{ov}$ (i.e., from 0 to 95 μs) and the second simulation time segment extends from time $T=T_{Stop}/2$ to time $T=T_{Stop}$ (i.e., from 75 μs to 150 μs). The portion of the resulting intermediate output voltage waveform 403 corresponding to the overlap (i.e., from 75 μs to 95 µs) is discarded and then the resulting intermediate output voltage waveforms 402 and 403 are concatenated, or merged, to achieve the same final resulting waveform 401 shown in FIG. 4.

Figure 6:
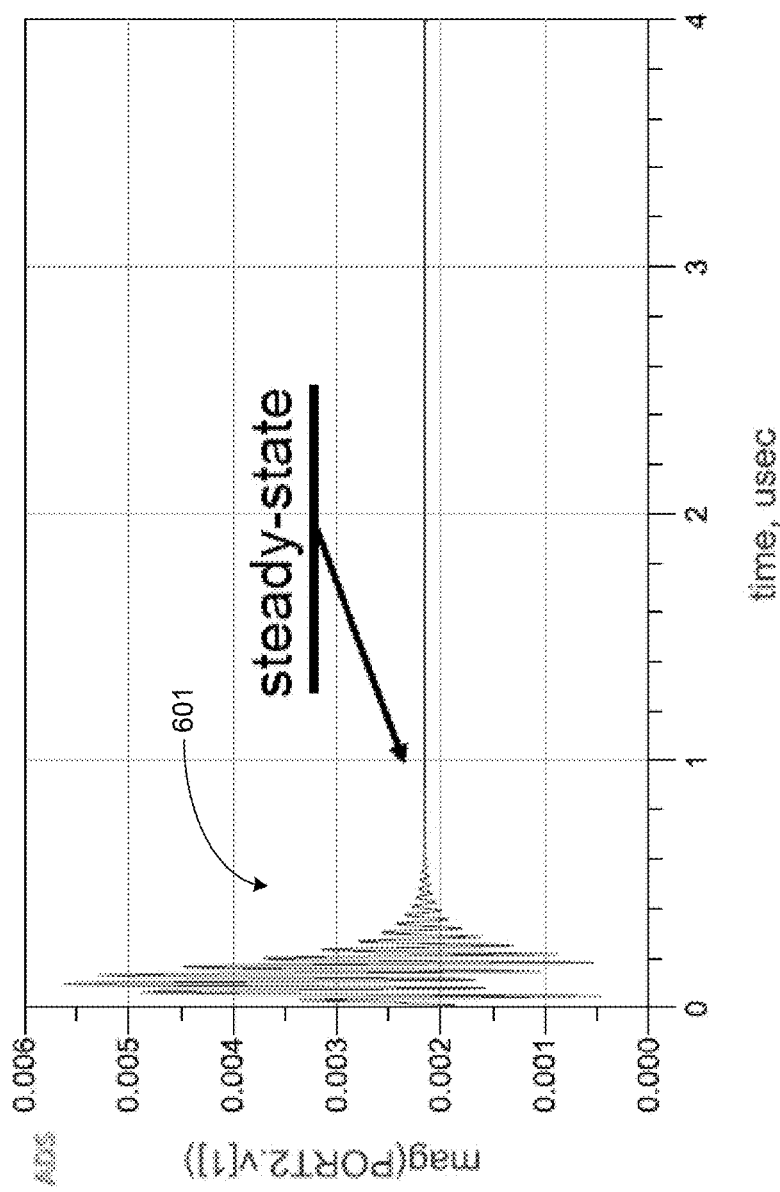
FIG. 6 illustrates an output waveform of an analog circuit during simulation as the output waveform transitions from an initial state to steady state.
Figure 7:
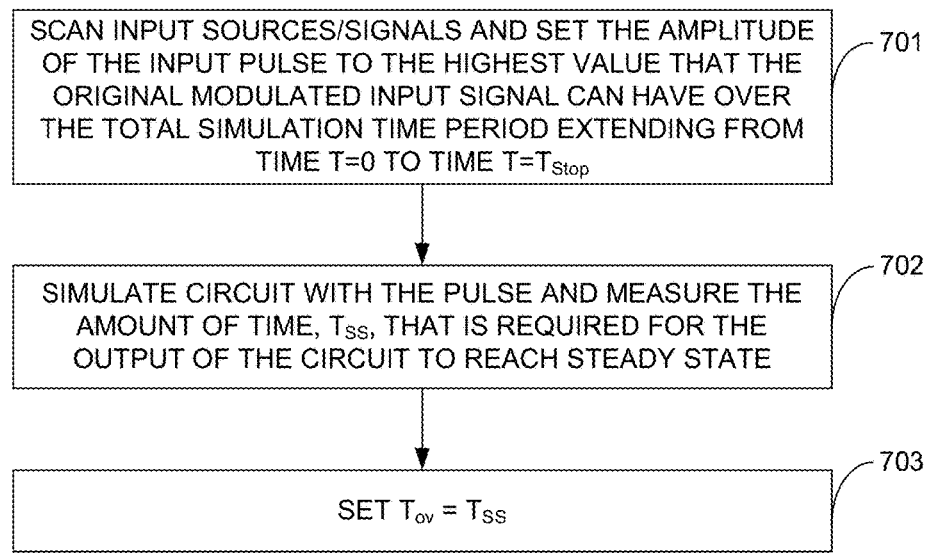
FIG. 7 illustrates a flow diagram of the process represented by block 201 in FIG. 2 in accordance with a preferred embodiment.

The manner in which the value for $T_{ov}$ is determined will now be described in more detail with reference to FIGS. 6 and 7. FIG. 6 illustrates an output waveform 601 of an analog circuit (not shown) during simulation as the output waveform transitions from an initial state to steady state. FIG. 7 illustrates a flow diagram of the process represented by block 201 in FIG. 2 in accordance with a preferred embodiment. In a typical transient-based simulation, multiple input signals are used. Therefore, this discussion assumes that the simulation to be performed involves using multiple input signals. During the actual simulation, the amplitude of the current or voltage for each input signal waveform can vary arbitrarily over the entire simulation time window, i.e., from time T=0 to time T=$T_{Stop}$. In block 701, a determination is made as to the maximum amplitudes of the voltage or current, depending on the input signal type, that the input signals can have over the entire simulation time window. This is typically accomplished by causing the system processor 102 of the EDA system 100 to execute a scan command that scans the input sources/signals to determine their amplitudes over the entire simulation time window. In accordance with the preferred embodiment, the amplitudes of the RF or DC input pulses that are used as the input waveforms for the simulation to determine $T_{ov}$ are set to the highest amplitude values observed during the scan, as indicated by block 701. The circuit is then simulated using the input pulse signals having those amplitudes and the amount of time that it takes the outputs of the simulated circuit to reach steady state, $T_{SS}$, is measured, as indicated by block 702. In the example shown in FIG. 6, the analog circuit being simulated is a narrowband filter and the amount of time that it takes the output to reach steady state $T_{SS}$ is about 1 µs. Therefore, the $T_{ov}$ value is set at 1 µs. This latter step is represented by block 703. The process then proceeds in the manner described above with reference to blocks 202-206 of FIG. 2.

The computer code executed by the system processor 102 and by the processing cores 104$_1$-104$_L$ to perform the methods shown in FIGS. 2 and 7 is stored on one or more non-transitory computer-readable memory devices, such as system memory 103 or results memory devices 105$_1$-105$_L$. The computer-readable memory devices may also be on-board memory of the system processor 102 or of the processing cores 104$_1$-104$_L$.

While the invention has been illustrated and described in detail in the drawings and foregoing description, such illustration and description are to be considered illustrative or exemplary and not restrictive; the invention is not limited to the disclosed embodiments. For example, the system 100 shown in FIG. 1 is one of many possible configurations that may be used to perform the methods of the invention, as will be understood by persons of skill in the art in view of the description provided herein. Variations may also be made to the methods. For example, the order of the steps represented by blocks 201 and 202 can be reversed. Other variations to the disclosed embodiments can be understood and effected by those skilled in the art in practicing the claimed invention, from a study of the drawings, the disclosure, and the appended claims.

What is claimed is:

1. An electronic design automation (EDA) system comprising:
    a user interface (UI);
    memory; and
    processing logic in communication with the UI and with the memory, the processing logic being configured to simulate analog circuits by:
    for a preselected analog circuit to be simulated using a transient-based simulation algorithm, determining an overlap time period, $T_{Ov}$, based on an amount of time required for output signals of the preselected analog circuit to settle to steady state when predetermined input signals are used during a simulation of the preselected analog circuit;
    segmenting a total simulation time for the transient-based simulation algorithm into n simulation time segments, where n is a positive integer that is greater than or equal to 2;
    overlapping respective beginning portions of second through $n^{th}$ simulation time segments with respective end portions of first through $(n-1)^{th}$ simulation time segments, respectively, by the overlap time period, $T_{Ov}$;
    simulating the n simulation time segments in parallel to obtain n intermediate simulation results, respectively, wherein second through $n^{th}$ intermediate simulation results have beginning portions of time lengths $T_Ov$ corresponding to the overlapped beginning and end portions of adjacent simulation time segments; and
    truncating all but a first of the intermediate simulation results by discarding the beginning portions of all but the first of the intermediate simulation results and merging the intermediate simulation results into a final simulation result.

2. The EDA system of claim 1, wherein the processing logic comprises at least n processing cores, each processing core simulating a respective simulation time segment.

3. The EDA system of claim 2, wherein the processing logic comprises a system processor that performs the segmenting and overlapping steps and assigns the simulation time segments to the respective processing cores.

4. The EDA system of claim 3, wherein the system processor performs the step of truncating and merging the intermediate simulation results into the final simulation result.

5. The EDA system of claim 4, wherein the memory comprises system memory and results memory, the system memory having computer code stored therein for execution by the system processor, and wherein the results memory comprises at least n results memory devices, each of the results memory devices storing the intermediate simulation result obtained by a respective processing core.

6. The EDA system of claim 2, wherein the processing cores are located on a graphical processor unit (GPU) card.

7. The EDA system of claim 3, wherein the processing cores are contained in one or more computers that are in communication with a system processor via a network.

8. The EDA system of claim 6, wherein the predetermined input signals are pulsed radio frequency (RF) or direct current (DC) signals having a preselected amplitudes.

9. The EDA system of claim 8, wherein the preselected amplitudes are highest amplitudes that the input signals used during actual simulation can have over the total simulation time of the preselected analog circuit.

10. A method for reducing an amount of time required to simulate analog circuits, the method comprising:
    in processing logic,
    determining an overlap time period, $T_{ov}$, based on an amount of time required for output signals of a preselected analog circuit to settle to steady state when predetermined input signals are used during a transient-based simulation of the preselected analog circuit;

segmenting a total simulation time for the transient-based simulation into n simulation time segments, where n is a positive integer that is greater than or equal to 2;

overlapping respective beginning portions of second through $n^{th}$ simulation time segments with respective end portions of first through $(n-1)^{th}$ simulation time segments, respectively, by the overlap time period, $T_{ov}$;

simulating the n simulation time segments in parallel to obtain n intermediate simulation results, respectively, wherein second through $n^{th}$ intermediate simulation results have beginning portions of time lengths $T_{ov}$ corresponding to the overlapped beginning and end portions of adjacent simulation time segments; and truncating all but a first of the intermediate simulation results by discarding the beginning portions of all but the first of the intermediate simulation results and merging the intermediate simulation results into a final simulation result.

11. The method of claim 10, wherein the processing logic includes at least a system processor and a plurality of processing cores, the steps of determining $T_{ov}$, segmenting the total simulation time and overlapping the simulation time segments being performed by the system processor, and wherein the system processor allocates the n simulation time segments to the respective processing cores, and wherein the processing cores perform the simulations of the respective simulation time segments in parallel.

12. The method of claim 10, wherein the predetermined input signals are pulsed radio frequency (RF) signals having preselected amplitudes.

13. The method of claim 12, wherein the preselected amplitudes are highest amplitudes that the input signals can have over the total simulation time of the preselected analog circuit.

14. The method of claim 10, wherein the predetermined input signals are pulsed direct current (DC) signals having preselected amplitudes.

15. The method of claim 14, wherein the preselected amplitudes are highest amplitudes that the input signals can have over the total simulation time of the preselected analog circuit.

16. A computer program embodied on a non-transitory computer-readable medium, the computer program comprising computer code for execution by a processor, the computer code comprising:

a first code portion for determining an overlap time period, $T_{ov}$, based on an amount of time required for output signals of a preselected analog circuit to settle to steady state when predetermined input signals are used during a simulation of the preselected analog circuit;

a second code portion for segmenting a total simulation time for the preselected analog circuit simulation into n simulation time segments, where n is a positive integer that is greater than or equal to 2;

a third code portion for overlapping respective beginning portions of second through $n^{th}$ simulation time segments with respective end portions of first through $(n-1)^{th}$ simulation time segments, respectively, by the overlap time period, $T_{ov}$; and a fourth code portion for allocating the overlapped simulation time segments to n processing cores for simulation of the n simulation time segments, respectively.

17. The computer program of claim 16, wherein the predetermined input signals are pulsed radio frequency (RF) signals.

18. The computer program of claim 17, and wherein a preselected amplitude is a highest amplitude that a input signal can have over the total simulation time of the preselected analog circuit.

19. The computer program of claim 16, wherein the predetermined input signals are pulsed direct current (DC) signals having preselected amplitudes.

20. The computer program of claim 19, wherein the preselected amplitudes are highest amplitudes that the input signals can have over the total simulation time of the preselected analog circuit.

* * * * *